US 8,866,309 B2

(12) United States Patent
Chang et al.

(10) Patent No.: US 8,866,309 B2
(45) Date of Patent: Oct. 21, 2014

(54) CHIP PACKAGE STRUCTURE

(71) Applicant: Industrial Technology Research Institute, Hsinchu (TW)

(72) Inventors: Jing-Yao Chang, New Taipei (TW); Tao-Chih Chang, Taoyuan County (TW); Yu-Wei Huang, Chiayi (TW); Yu-Min Lin, Changhua County (TW); Shin-Yi Huang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 116 days.

(21) Appl. No.: 13/727,599

(22) Filed: Dec. 27, 2012

(65) Prior Publication Data

US 2013/0168798 A1 Jul. 4, 2013

(30) Foreign Application Priority Data

Dec. 30, 2011 (TW) .............................. 100149703 A

(51) Int. Cl.
*H01L 23/48* (2006.01)
*H01L 29/40* (2006.01)

(52) U.S. Cl.
USPC ............ 257/777; 257/778; 257/621; 438/108

(58) Field of Classification Search
CPC ....................................................... H01L 25/16
USPC ............................ 257/777–778, 621; 438/108
See application file for complete search history.

(56) References Cited

U.S. PATENT DOCUMENTS

| 5,356,485 A | 10/1994 | Kreider |
| 6,297,441 B1 | 10/2001 | Macris |
| 6,300,150 B1 | 10/2001 | Venkatasubramanian |
| RE41,801 E | 10/2010 | Venkatasubramanian |
| 7,855,397 B2 | 12/2010 | Alley et al. |
| 7,893,529 B2 | 2/2011 | Hsu et al. |
| 2006/0019484 A1* | 1/2006 | Chen et al. ................ 438/618 |

(Continued)

FOREIGN PATENT DOCUMENTS

| TW | 200416787 | 9/2004 |
| TW | 200816339 | 4/2008 |

OTHER PUBLICATIONS

B.A. Cook et al., "TiNiSn: A Gateway to the (1,1,1) Intermetallic Compounds", 15th International Conference on Themoelectrics (1996), Mar. 1996, pp. 122-127.

(Continued)

*Primary Examiner* — Theresa T. Doan
(74) *Attorney, Agent, or Firm* — Jianq Chyun IP Office

(57) ABSTRACT

A first back surface of a first chip faces toward a carrier. A first active surface of the first chip has first pads and a first insulting layer thereon. A second chip is disposed on the first chip and electrically connected to the carrier. A second active surface of the second chip faces toward the first active surface. The second active surface has second pads and a second insulting layer thereon. Bumps connect the first and second pads. First and second daisy chain circuits are respectively disposed on the first and second insulting layers. Hetero thermoelectric device pairs are disposed between the first and second chips and connected in series by the first and second daisy chain circuits, and constitute a circuit with an external device. First and second heat sinks are respectively disposed on a second surface of the carrier and a second back surface of the second chip.

21 Claims, 4 Drawing Sheets

(56) References Cited

U.S. PATENT DOCUMENTS

| | | | |
|---|---|---|---|
| 2006/0210790 A1 | 9/2006 | Horio et al. | |
| 2006/0289050 A1 | 12/2006 | Alley et al. | |
| 2007/0012938 A1 | 1/2007 | Yu et al. | |
| 2007/0264757 A1* | 11/2007 | Kwon et al. | 438/127 |
| 2009/0072385 A1 | 3/2009 | Alley et al. | |

OTHER PUBLICATIONS

"Thermoelectric Effect", retrieved from efunda engineering fundamentals on Dec. 2012—http://www.efunda.com/designstandards/sensors/thermocouples/thermocouples/thmcpl_theory, pp. 1-4.

"Office Action of Taiwan Counterpart Application", issued on Mar. 24, 2014, p1-p5.

S. Culp et al., "Complex MNiSn Phases as Stable High-Temperature Thermoelectric Materials", 2005 International Conference on Thermoelectrics, Jun. 2005, p. 387-p. 390.

M.G. Shelyapina et al., "Electronic structure of MCuSn compounds with M=Ti, Zr and Hf", Journal of Alloys and Compounds 347 (2002) 43-51, Apr. 2002, p. 43-p. 51.

Yu Gorelenko et al., "Thermoelectric power factor in intermetallic semiconductors with MgAgAs type of structure: requirements for highest values and thermal stability achievement", International Conference on Thermoelectries, Aug. 2006, p. 720-p. 725.

C. Uher et al., "Thermoelectric Properties of Bi-Doped Half-Heusler Alloys", 18th International conference on Thermoelectrics (1999), Aug. 29, 1999-Sep. 2, 1999, p. 56-p. 59.

* cited by examiner

CHIP PACKAGE STRUCTURE

CROSS-REFERENCE TO RELATED APPLICATION

This application claims the priority benefit of Taiwan application serial no. 100149703, filed Dec. 30, 2011. The entirety of the above-mentioned patent application is hereby incorporated by reference herein and made a part of this specification.

TECHNICAL FIELD

The technical field relates to a chip package structure.

BACKGROUND

In general, an integrated circuit (IC) is subjected to a packaging process after being fabricated, so as to protect a chip from an external damage, and electrodes on the chip are conductively connected to an external device (e.g., a printed circuit board, a display panel, etc) by using a carrier to expend a spacing of the electrodes. Ball grid array (BGA) and chip-on-film (COF) packages are both the commonly seen packaging technologies.

Functions of electronic products continue to expand while sizes and weights of the electronic products continue to shrink, thereby causing functional requirements of the chip to continue to increase, an amount of I/O endpoints to correspondingly increase, whereas a size of the chip to continue to shrink, and a spacing between the chip and the carrier also shrinks. However, accompanying the increase in the chip functions, heat generated during an operation process is also increased, and impacts of the heat on a device performance are also tended to be evident.

Therefore, how to recycle and reuse the heat generated during the operation process of the chip to perform a thermoelectric conversion has become one of the emphasised technologies of industrial R & D in recent year.

SUMMARY

The disclosure provides a chip package structure having a thermoelectric conversion function.

The disclosure provides a chip package structure including a carrier, a first chip, a second chip, a plurality of bumps, a first daisy chain circuit, a second daisy chain circuit, a plurality of hetero thermoelectric element pairs, a first heat sink, a second heat sink and an encapsulant. The carrier has a first surface and a second surface opposite to each other. The first chip is disposed on the carrier. The first chip has a first active surface and a first back surface. The first back surface faces toward the first surface, and the first active surface has a plurality of first pads and a first insulting layer thereon. The second chip is disposed on the first chip and electrically connected to the carrier. The second chip has a second active surface and a second back surface. The second active surface faces toward the first active surface, and the second active surface has a plurality of second pads and a second insulting layer thereon. The bumps connect the first pads and the second pads as an electrical conduction of the first chip and the second chip. The first daisy chain circuit is disposed on the first insulting layer of the first active surface. The second daisy chain circuit is disposed on the second insulting layer of the second active surface. The hetero thermoelectric device pairs are disposed between the first chip and the second chip and connected in series by the first daisy chain circuit and second daisy chain circuit, and the hetero thermoelectric device pairs constitute a close circuit with an external device. The first heat sink is disposed on the second surface of the carrier. The second heat sink is disposed on the second back surface of the second chip. The first heat sink and the second heat sink have different heat dissipation efficiencies. The encapsulant covers the carrier, the first chip and the second chip.

The disclosure provides another chip package structure including a carrier, a first chip, a second chip, a third chip, a plurality of bumps, a plurality of first conducting vias, a first daisy chain circuit, a second daisy chain circuit, a third daisy chain circuit, a fourth daisy chain circuit, a second conducting via, a plurality of hetero thermoelectric device pairs, a first heat sink, a second heat sink and an encapsulant. The carrier has a first surface and a second surface opposite to each other. The first chip is disposed on the carrier. The first chip has a first active surface and a first back surface. The first back surface faces toward the first surface, and the first active surface has a plurality of first pads and a first insulting layer thereon. The second chip is disposed on the first chip. The second chip has a second active surface and a second back surface. The second active surface faces toward the first active surface, the second active surface has a plurality of second pads and a second insulting layer thereon, and the second back surface has a plurality of third pads and a third insulting layer thereon. The third chip is disposed on the second chip and electrically connected to the carrier. The third chip has a third active surface and a third back surface. The third active surface faces toward the second back surface, and the third active surface has a plurality of fourth pads and a fourth insulting layer thereon. The bumps connect the first pads and the second pads as an electrical conduction of the first chip and the second chip, and connect the third pads and the fourth pads as an electrical conduction of the third chip and the fourth chip. The first conducting vias are disposed in the second chip and connect the second pads and the third pads. The first daisy chain circuit is disposed on the first insulting layer of the first active surface. The second daisy chain circuit is disposed on the second insulting layer of the second active surface. The third daisy chain circuit is disposed on the third insulting layer of the second back surface. The fourth daisy chain circuit is disposed on the fourth insulting layer of the third active surface. The second conducting via is disposed in the second chip and connect the second daisy chain circuit and the third daisy chain circuit. The hetero thermoelectric device pairs are disposed between the first chip and the second chip, disposed between the second chip and the third chip, and connected in series by the first daisy chain circuit, the second daisy chain circuit, the second conducting via, the third daisy chain circuit and the fourth daisy chain circuit, and the hetero thermoelectric device pairs constitute a close circuit with an external device. The first heat sink is disposed on the second surface of the carrier. The second heat sink is disposed on the third back surface of the third chip. The first heat sink and the second heat sink have different heat dissipation efficiencies. The encapsulant covers the carrier, the first chip, the second chip and the third chip.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

First Embodiment

Figure 1:
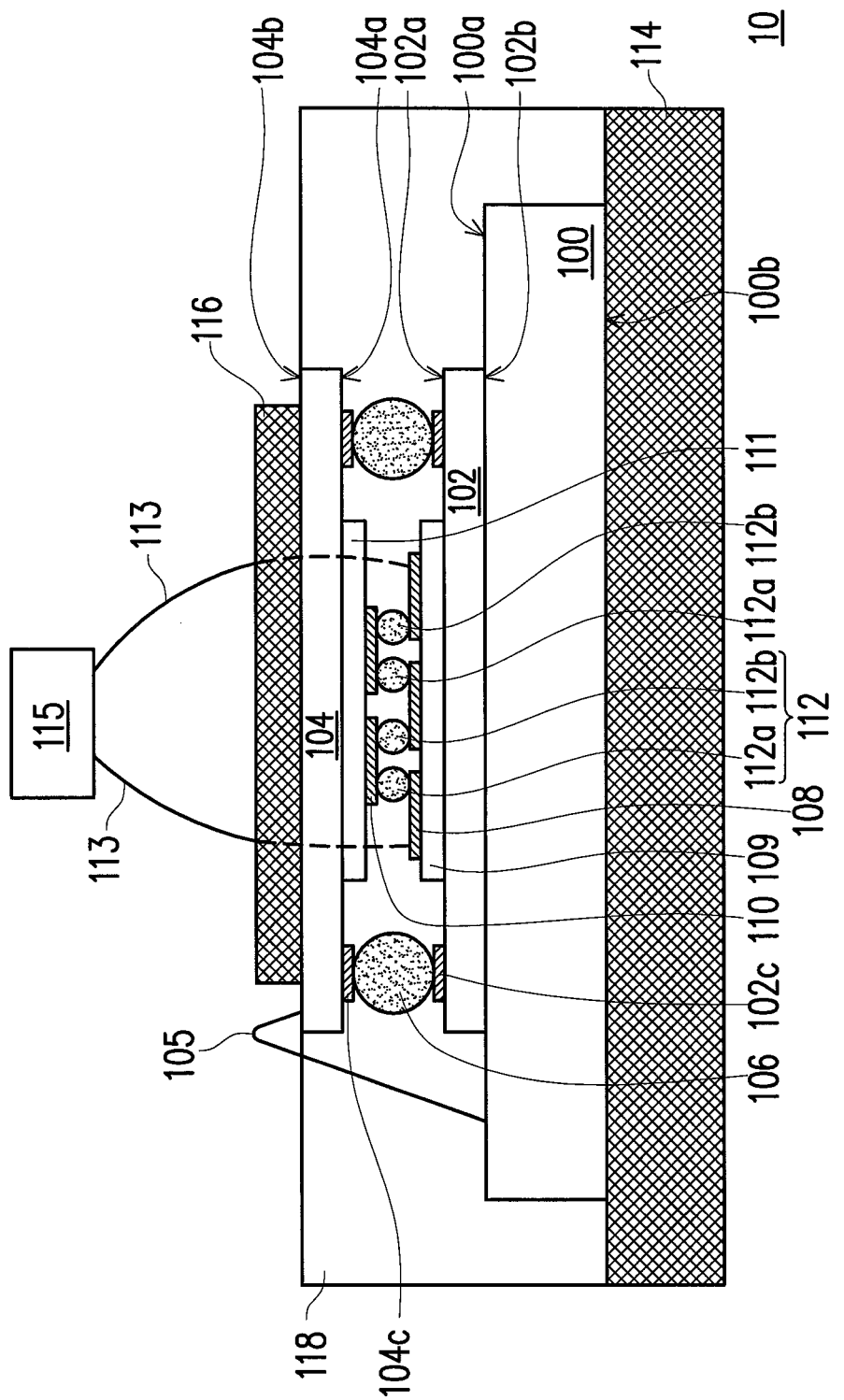
FIG. 1 is cross-sectional view schematically illustrating a chip package structure according to a first embodiment.

FIG. 1 is cross-sectional view schematically illustrating a chip package structure according to a first embodiment. Referring to FIG. 1, a chip package structure 10 includes a carrier 100, a first chip 102, a second chip 104, a plurality of bumps 106, a first daisy chain circuit 108, a second daisy chain circuit 110, a plurality of hetero thermoelectric device pairs 112, a first heat sink 114, a second heat sink 116 and an encapsulant 118. The carrier 100 has a first surface 100a and a second surface 100b opposite to each other. The carrier 100 may be a silicon chip, a silicon carbide chip, a gallium nitride chip, an organic carrier, an inorganic carrier or metal carrier. The carrier 100 is configured to bear the chips and other components disposed thereon.

The first chip 102 had a first active surface 102a and a first back surface 102b opposite to each other. The first chip 102 is disposed on the carrier 100 with a manner that the first back surface 102b faces toward the first surface 100a. The first active surface 102a has a plurality of first pads 102c thereon. The disclosure dose not intended to limit the types of the first chip 102. In the present embodiment, the first chip 102, for example, is a high power chip or a high heating chip.

The second chip 104 has a second active surface 104a and a second back surface 104b opposite to each other. The second chip 104 is disposed on the first chip 102 with a manner that the second active surface 104a faces toward the first active surface 100a; namely, the second chip 104 is disposed on the first chip 102 with a flip-chip method. The second active surface 104a has a plurality of second pads 104c thereon. In addition, in the present embodiment, the second chip 104 is electrically connected to the carrier 100 via a bonding wire 105. The disclosure does not intended to limit the types of the second chip 104. In the present embodiment, the second chip 104, for example, is a high power chip or a high heating chip.

The bumps 106 connect the first pads 102c and the second pads 104c so as to electrically connect the first chip 102 and the second chip 104. The first daisy chain circuit 108 is dispose on the first active surface 102a. In the present embodiment, the first daisy chain circuit 108 and the first active surface 102a have an insulting layer 109 disposed therebetween, so that the first daisy chain circuit 108 and the first chip 102 are electrically isolated. The second daisy chain circuit 110 is disposed on the second active surface 104a. In the present embodiment, the second daisy chain circuit 110 and the second active surface 104a have an insulting layer 111 disposed therebetween, so that the second daisy chain circuit 110 and the second chip 104 are electrically isolated. Namely, the first daisy chain circuit 108 is not a circuit layer in the first chip 102 that is configured to conduct current, and the second daisy chain circuit 110 is also not a circuit layer in the second chip 104 that is configured to conduct current.

The hetero thermoelectric device pairs 112 are disposed between the first chip 102 and the second chip 104, and connected in series by the first daisy chain circuit 108 and the second daisy chain circuit 110. In addition, the hetero thermoelectric device pairs 112 constitute a close circuit with an external device 115. In detail, in the present embodiment, the hetero thermoelectric device pairs 112 are each connected in series by the first daisy chain circuit 108 and second daisy chain circuit 110 to form a thermoelectric module, and two endpoints of the thermoelectric module are respectively connected to the external device 115 via bonding wires 113. The external device 115, for example, is an energy storage element configured to store electrical energy generated by the thermoelectric module. The energy storage element may be a component capable of storing electrical energy, such as a battery or a capacitor.

The following below further describes the hetero thermoelectric device pairs 112 in the present embodiment. Each hetero thermoelectric device pair 112 includes a first thermoelectric element 112a and a second thermoelectric element 112b. The first thermoelectric element 112a and the second thermoelectric element 112b have different Seebeck coefficient. With a temperature difference between the first chip 102 and the second chip 104, the thermoelectric module constituted by the hetero thermoelectric device pairs 112, the first daisy chain circuit 108 and the second daisy chain circuit 110 generates a Seebeck effect, a Peltier effect or a Thomson effect so as to attain a result of thermoelectric conversion. Materials of the first thermoelectric element 112a and the second thermoelectric element 112b each, for example, is a metal (e.g., nickel, bismuth or antimony), an alloy (e.g., silver-copper alloy or copper-nickel alloy), an alloy doping semiconductor intermetallic (e.g., silver-copper alloy doping PbTe or $Bi_2Te_3$ or silver doping PbTe or $Bi_2Te_3$), an intermetallic compound (e.g., $Cu_3Sn$, $Ag_3Sn$, $Ni_3Sn_4$ or $AuSn_4$), a semiconductor intermetallic (PbTe or $Bi_2Te_3$), a carbon nanotube, a metallic glass or ceramic (titanium nitride or titanium carbide). The disclosure does not intended to limit a combination of the material of the first thermoelectric element 112a and the material of the second thermoelectric element 112b, as long as the material of the first thermoelectric element 112a and the material of the second thermoelectric element 112b may satisfy a definition of thermoelectric conversion characteristic. In addition, in other embodiments, through selecting the material, the first thermoelectric element 112a may be one of a P-type thermoelectric element and an N-type thermoelectric element, whereas the second thermoelectric element 112b may be the other one of the P-type thermoelectric element and the N-type thermoelectric element. A material of the P-type thermoelectric element, for example, is BiTe or $Cu_{0.5}Ag_{0.5}InTe_2$. A material of the N-type thermoelectric element, for example, is PbTe, $ZrNi_3Sn_4$ or $TiNi_3Sn_4$.

The first heat sink 114 is disposed on the second surface 100b of the carrier 100. The second heat sink 116 is disposed on the second back surface 104b of the second chip 104. The first heat sink 114 and the second heat sink 116 have different heat dissipation efficiencies. The disclosure does not intended to limit the types of the first heat sink 114 and the second heat sink 116. The first heat sink 114 and the second heat sink 116 may have different materials, sizes or heating dissipation means, so as to achieve having different heat dissipation efficiencies, respectively. Sine the first heat sink 114 and the second heat sink 116 have different heat dissipation efficiencies, two ends (parts that are respectively close to the first chip 102 and the second chip 104) of the hetero thermoelectric device pairs 112 may have large temperature gradients therebetween to prolong a time for reaching a thermal equilibrium, and thus may continuously generate electrical energy.

The encapsulant 118 covers the carrier 100, the first chip 102 and the second chip 104 to protect the carrier 100, the first chip 102, the second chip 104 and various components between the first chip 102 and the second chip 104.

Second Embodiment

Figure 2:
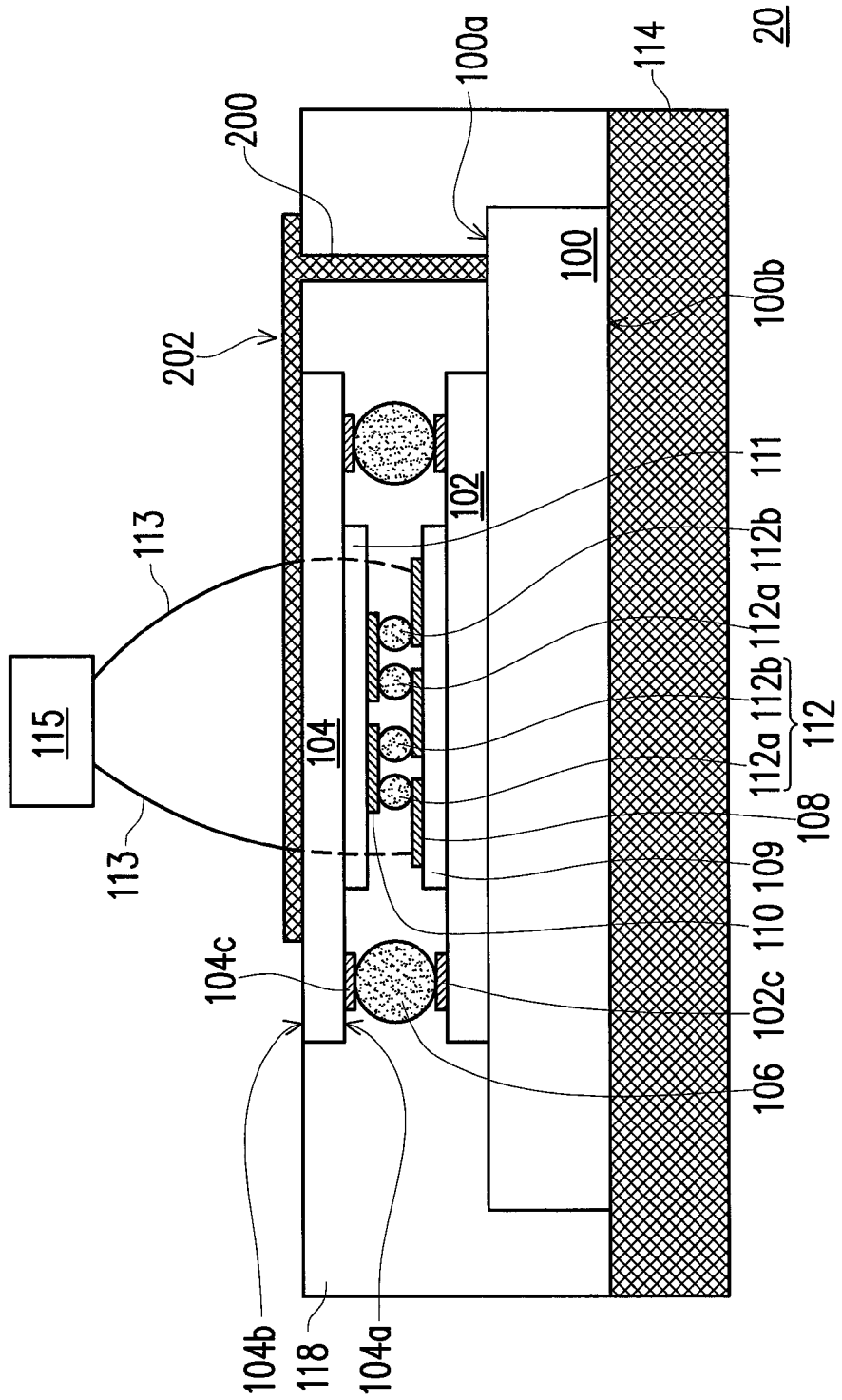
FIG. 2 is cross-sectional view schematically illustrating a chip package structure according to a second embodiment.

FIG. 2 is cross-sectional view schematically illustrating a chip package structure according to a second embodiment. In FIG. 2, components that are the same as the ones in FIG. 1 are presented by the same reference numerals, and thus are not described herein. Referring to FIG. 2, in the present embodiment, a difference between a chip package structure 20 and the chip package structure 10 is that: in the chip package structure 20, the second chip 104 is electrically connected to the carrier 100 via an interconnection 200. Moreover, a circuit layer 202 in the interconnection 200 is located on the second chip 104, and the circuit layer 202, in addition to be configured to electrically connect the second chip 104 and the carrier 100, may also replace the second heat sink 116 in the chip package structure 10.

Third Embodiment

Figure 3:
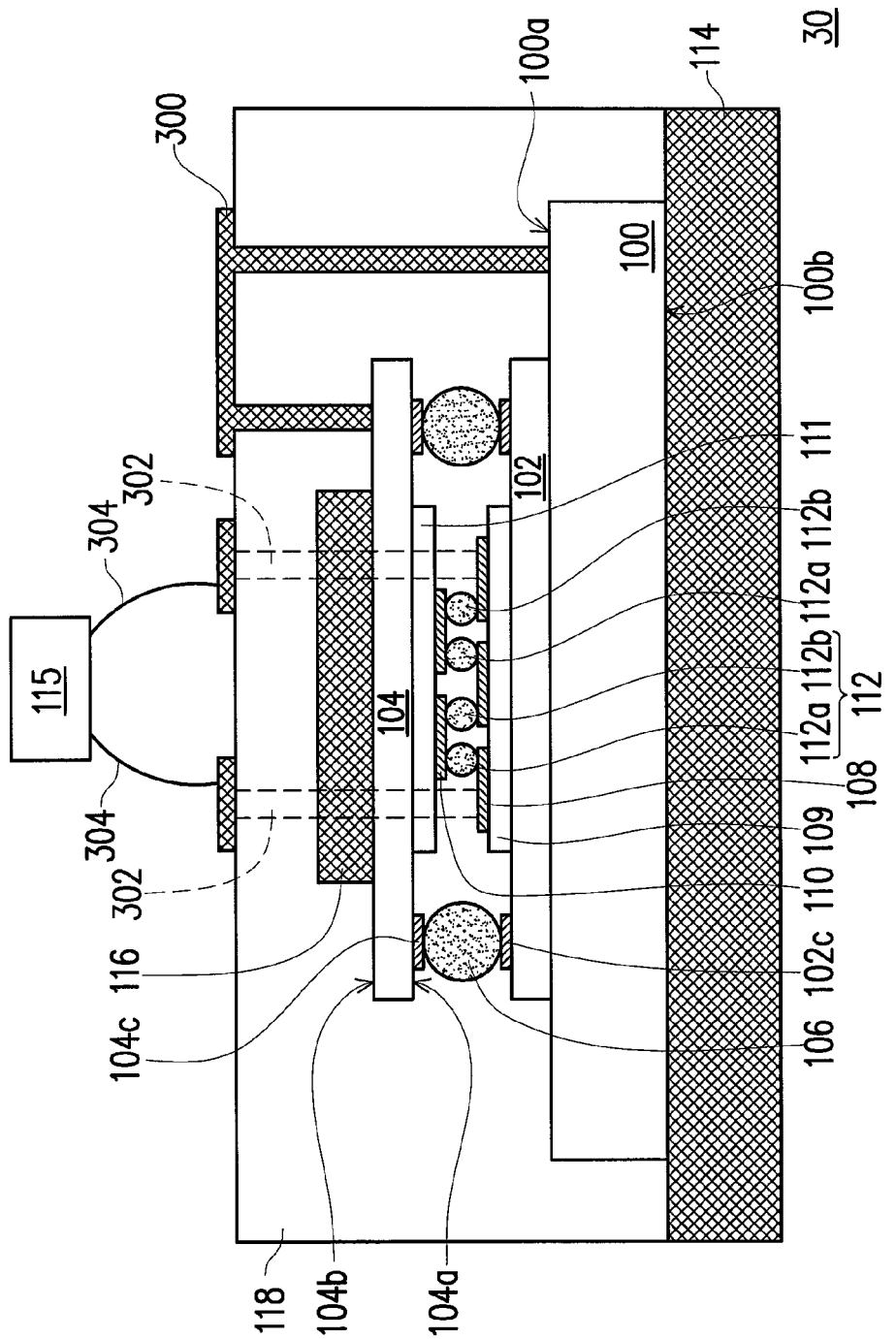
FIG. 3 is cross-sectional view schematically illustrating a chip package structure according to a third embodiment.

FIG. 3 is cross-sectional view schematically illustrating a chip package structure according to a third embodiment. In FIG. 3, components that are the same as the ones in FIG. 1 are presented by the same reference numerals, and thus are not described herein. Referring to FIG. 3, in the present embodiment, a difference between a chip package structure 30 and the chip package structure 10 is that: in the chip package structure 30, the second chip 104 is electrically connected the carrier 100 via an interconnection 300. In addition, the two endpoints of the thermoelectric module constituted by the hetero thermoelectric device pairs 112, the first daisy chain circuit 108 and the second daisy chain circuit 110 are respectively connected to the external device 115 via an interconnection 302 and a bonding wire 304. It is to be noted that, the interconnection 302, in stead of passing through the second chip 104 and the second heat sink 116, it bypasses the second chip 104 and the second heat sink 116, and is electrically connected to the external device 115 at the outside of the encapsulant 118 via the bonding wire 304.

Fourth Embodiment

Figure 4:
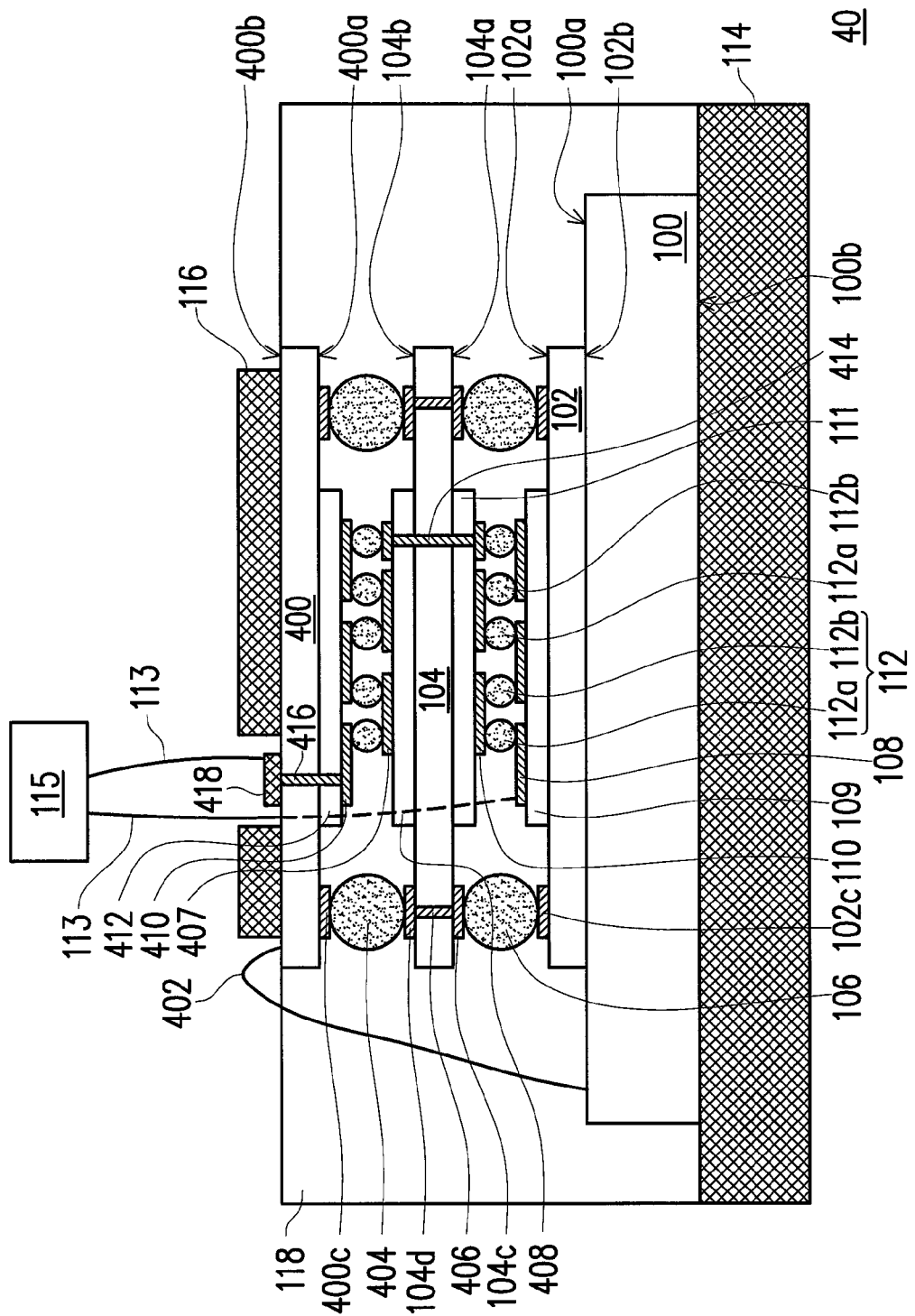
FIG. 4 is cross-sectional view schematically illustrating a chip package structure according to a fourth embodiment.

FIG. 4 is cross-sectional view schematically illustrating a chip package structure according to a fourth embodiment. In FIG. 4, components that are the same as the ones in FIG. 1 are presented by the same reference numerals, and thus are not described herein. Referring to FIG. 4, in the present embodiment, a difference between a chip package structure 40 and the chip package structure 10 is that: in the chip package structure 40, there are three stacked chips. Certainly, the disclosure is not limited thereto; in other embodiments, there may further be a plurality of stacked chips. In the chip package structure 40, the second chip 104 is further disposed with a third chip 400 thereon. In detail, the second back surface 104b of the second chip 104 has a plurality of third pads 104d thereon. The third chip 400 has a third active surface 400a and a third back surface 400b opposite to each other. The third chip 400 is disposed on the second chip 104 with a manner that the third active surface 400a faces toward the second back surface 104b; namely, the third chip 400 is disposed on the second chip 104 with the flip-chip method. In addition, in the present embodiment, the second chip 104 is not electrically connected to the carrier 100 via the bonding wire 105, and instead, the third chip 400 is electrically connected to the carrier 100 via a bonding wire 402. Certainly, in other embodiments, the third chip 400 may also be electrically connected to the carrier 100 via an interconnection (as described in the third embodiment). The third active surface 400a has a plurality of fourth pads 400c thereon. A plurality of bumps 404 connects the third pads 104d and the fourth pads 400c. A plurality of first conducting vias 406 is disposed in the second chip 104 and connects the second pads 104c and the third pads 104d.

In addition, a third daisy chain circuit 407 is disposed on the second back surface 104b. In the present embodiment, the third daisy chain circuit 407 and the second back surface 104b are disposed with an insulting layer 408 therebetween, so that the third daisy chain circuit 407 and the second chip 104 are electrically isolated. A fourth daisy chain circuit 410 is disposed on the third active surface 400a. In the present embodiment, the fourth daisy chain circuit 410 and the third active surface 400a are disposed with an insulting layer 412 therebetween, so that the fourth daisy chain circuit 410 and the third chip 400 are electrically isolated. A second conducting via 414 is disposed in the second chip 104 and connect the second daisy chain circuit 110 and the third daisy chain circuit 407. The hetero thermoelectric device pairs 112, in addition to being disposed between the first chip 102 and the second chip 104, is also disposed between the second chip 104 and the third chip 400, and is connected in series by the third daisy chain circuit 407 and the fourth daisy chain circuit 410. A third conducting via 416 is disposed in the third chip 400 and connects the fourth daisy chain circuit 410 and the circuit layer 418. As such, the hetero thermoelectric device pairs 112 are connected in series with each other by the first daisy chain circuit 108, the second daisy chain circuit 110, the third daisy chain circuit 407 and the fourth daisy chain circuit 410 to form a thermoelectric module, and two endpoints of the thermoelectric module are respectively connected to the external device 115 via the third conducting via 416, the circuit layer 418 and the bonding wire 113. Certainly, in other embodiments, the two endpoints of the thermoelectric module may also be both connected to the external device 115 via only the wire (as illustrated in the second embodiment).

The second heat sink 116 is disposed on the third back surface 400b of the third chip 400. The encapsulant 118 covers the carrier 100, the first chip 102, the second chip 104 and the third chip 400 so as to protect the carrier 100, the first chip 102, the second chip 104, the third chip 400 and the various components located between the first chip 102 and the second chip 104, and between the second chip 104 and the third chip 400.

It is to be mentioned in particular that, in each of the aforementioned embodiments, the first thermoelectric element 112a, the second thermoelectric element 112b and the bumps 106, 404 all adopt a manner of firstly printing or injecting a pasty raw material at the first daisy chain circuit 108, next disposing the second chip 104 on the first chip 102 via the flip chip method, and then performing a high-temperature sintering to form the first thermoelectric element 112a, the second thermoelectric element 112b and the bumps 106, 404.

In summary, in the chip package structure of the disclosure, the hetero thermoelectric device pairs are disposed between the chips, the temperature differences between the two sides of the hetero thermoelectric device pairs are generated by using two heat sinks having different heat dissipation efficiencies, and the hetero thermoelectric device pairs and the external device constitute a close circuit. Therefore, heat generated during the operations of the chips may be effectively used to perform the thermoelectric conversion in the disclosure.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A chip package structure, comprising:
   a carrier having a first surface and a second surface opposite to each other;
   a first chip disposed on the carrier, the first chip having a first active surface and a first back surface, the first back surface facing toward the first surface, and the first active surface having a plurality of first pads and a first insulting layer thereon;
   a second chip disposed on the first chip and electrically connected to the carrier, the second chip having a second active surface and a second back surface, the second active surface facing toward the first active surface, and the second active surface having a plurality of second pads and a second insulting layer thereon;
   a plurality of bumps connecting the first pads and the second pads as an electrical conduction of the first chip and the second chip;
   a first daisy chain circuit disposed on the first insulting layer of the first active surface;
   a second daisy chain circuit disposed on the second insulting layer of the second active surface;
   a plurality of hetero thermoelectric device pairs disposed between the first chip and the second chip, and connected in series by the first daisy chain circuit and the second daisy chain circuit, and the hetero thermoelectric device pairs constituted a circuit with an external device;
   a first heat sink disposed on the second surface of the carrier;
   a second heat sink disposed on the second back surface of the second chip, wherein the first heat sink and the second heat sink have different heat dissipation efficiencies; and
   an encapsulant covering the carrier, the first chip and the second chip.

2. The chip package structure as recited in claim 1, wherein each hetero thermoelectric device pair comprises a first thermoelectric element and a second thermoelectric element, and the first thermoelectric element and the second thermoelectric element have different Seebeck coefficients.

3. The chip package structure as recited in claim 2, wherein materials of the first thermoelectric element and the second thermoelectric element each comprises metal, alloy, alloy doping semiconductor intermetallic, intermetallic compound, carbon nanotube, metallic glass or ceramic.

4. The chip package structure as recited in claim 2, wherein the first thermoelectric element is one of a P-type thermoelectric element and an N-type thermoelectric element, and the second thermoelectric element is the other one of the P-type thermoelectric element and the N-type thermoelectric element.

5. The chip package structure as recited in claim 1, wherein the second chip is electrically connected to the carrier via a bonding wire.

6. The chip package structure as recited in claim 1, wherein the second chip is electrically connected to the carrier via an interconnection.

7. The chip package structure as recited in claim 6, wherein the second heat sink is a part of the interconnect.

8. The chip package structure as recited in claim 1, wherein the hetero thermoelectric device pairs and the external device constitute the circuit via an external connection.

9. The chip package structure as recited in claim 1, wherein the hetero thermoelectric device pairs and the external device constitute the circuit via an interconnection and an external connection.

10. The chip package structure as recited in claim 1, wherein the first chip and the second chip each comprise a high power chip or a high heating chip.

11. The chip package structure as recited in claim 1, wherein the external device comprises an energy storage element.

12. A chip package structure, comprising:
    a carrier having a first surface and a second surface opposite to each other;
    a first chip disposed on the carrier, the first chip having a first active surface and a first back surface, the first back surface facing toward the first surface, and the first active surface having a plurality of first pads and a first insulting layer thereon;
    a second chip disposed on the first chip, the second chip having a second active surface and a second back surface, the second active surface facing toward the first active surface, and the second active surface having a plurality of second pads and a second insulting layer thereon, while the second back surface having a plurality of third pads and a third insulting layer thereon;
    a third chip disposed on the second chip and electrically connected to the carrier, the third chip having a third active surface and a third back surface, the third active surface facing toward the second back surface, and the third active surface having a plurality of fourth pads and a fourth insulting layer thereon;
    a plurality of bumps connecting the first pads and the second pads as an electrical conduction of the first chip and the second chip, and connecting the third pads and the fourth pads as an electrical conduction of the third chip and the fourth chip;
    a plurality of first conducting vias disposed in the second chip and connecting the second pads and the third pads;
    a first daisy chain circuit disposed on the first insulting layer of the first active surface;
    a second daisy chain circuit disposed on the second insulting layer of the second active surface;
    a third daisy chain circuit disposed on the third insulting layer of the second back surface;
    a fourth daisy chain circuit disposed on the fourth insulting layer of the third active surface;
    a second conducting via disposed in the second chip and connecting the second daisy chain circuit and the third daisy chain circuit;
    a plurality of hetero thermoelectric device pairs disposed between the first chip and the second chip, disposed between the second chip and the third chip, connected in series by the first daisy chain circuit, the second daisy chain circuit, the second conducting via, the third daisy chain circuit and the fourth daisy chain circuit, and the hetero thermoelectric device pairs constitute a circuit with an external device;
    a first heat sink disposed on the second surface of the carrier;

a second heat sink disposed on the third back surface of the third chip, wherein the first heat sink and the second heat sink have different heat dissipation efficiencies; and an encapsulant covering the carrier, the first chip, the second chip and the third chip.

13. The chip package structure as recited in claim 12, wherein each hetero thermoelectric device pair comprises a first thermoelectric element and a second thermoelectric element, and the first thermoelectric element and the second thermoelectric element have different Seebeck coefficients.

14. The chip package structure as recited in claim 13, wherein materials of the first thermoelectric element and the second thermoelectric element each comprises metal, alloy, alloy doping semiconductor intermetallic, intermetallic compound, carbon nanotube, metallic glass or ceramic.

15. The chip package structure as recited in claim 13, wherein the first thermoelectric element is one of a P-type thermoelectric element and an N-type thermoelectric element, and the second thermoelectric element is the other one of the P-type thermoelectric element and the N-type thermoelectric element.

16. The chip package structure as recited in claim 12, wherein the third chip is electrically connected to the carrier via a bonding wire.

17. The chip package structure as recited in claim 12, wherein the third chip is electrically connected to the carrier via an interconnection.

18. The chip package structure as recited in claim 17, wherein the second heat sink is a part of the interconnection.

19. The chip package structure as recited in claim 12, wherein the hetero thermoelectric device pairs and the external device constitute the circuit via an external connection.

20. The chip package structure as recited in claim 12, wherein the first chip, the second chip and the third chip each comprises a high power chip or a high heating chip.

21. The chip package structure as recited in claim 12, wherein the external device comprises an energy storage element.

\* \* \* \* \*